US006784823B1

United States Patent
Koike

(10) Patent No.: US 6,784,823 B1
(45) Date of Patent: Aug. 31, 2004

(54) RAIL TO RAIL DUAL SLOPE ADC

(75) Inventor: Hidcharu Koike, Yokohama (JP)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/707,667

(22) Filed: Dec. 31, 2003

(51) Int. Cl.[7] .................................................. H03M 1/82
(52) U.S. Cl. ........................ 341/167; 341/128; 341/155; 341/118
(58) Field of Search ................................ 341/118, 128, 341/136, 155, 167

(56) References Cited

U.S. PATENT DOCUMENTS

| 4,050,065 | A | * | 9/1977 | Mosley et al. ............... 341/118 |
| 4,082,998 | A | * | 4/1978 | Marriott .................... 324/99 D |
| 4,217,542 | A | * | 8/1980 | Abbe et al. ................. 324/662 |
| 5,194,868 | A | * | 3/1993 | Bahrig et al. ................ 341/167 |
| 5,519,352 | A | * | 5/1996 | Mo ............................. 327/345 |
| 5,592,168 | A | * | 1/1997 | Liao ............................ 341/167 |
| 5,612,698 | A | * | 3/1997 | Reay ........................... 341/167 |
| 6,243,034 | B1 | * | 6/2001 | Regier ......................... 341/166 |
| 6,366,231 | B1 | * | 4/2002 | Rao et al. .................... 341/166 |
| 6,646,586 | B1 | * | 11/2003 | Lee et al. ..................... 341/167 |

* cited by examiner

Primary Examiner—Michael Tokar
Assistant Examiner—Linh V. Nguyen
(74) Attorney, Agent, or Firm—Jianq Chyun IP Office

(57) ABSTRACT

A rail to rail dual slope analog to digital converter (ADC) is provided in the present invention. The circuit scheme has an input stage, an integrator stage, and a comparator stage, where an operational amplifier (OPAMP) can be comprised of each stage respectively. The positive input of the integrator OPAMP coupling to an analog ground, and switching the negative feedback loop of the input stage between an input voltage, a reference voltage, and a short circuit, controlling a plurality of switches among circuit connections results in different phases of the dual slope ADC. A finer resolution is thus obtained according to rail to rail input voltage range. Also, the integrator OPAMP can be eliminated from the circuit of the present invention in order to reduce pins, with connecting an end of the external integrator capacitor to ground.

7 Claims, 6 Drawing Sheets

RAIL TO RAIL DUAL SLOPE ADC

BACKGROUND OF INVENTION

1. Field of the Invention

This invention generally relates to a dual slope analog to digital converter, and more particularly to a dual slope analog to digital converter providing rail to rail input voltage range and finer resolution.

2. Description of Related Art

A conventional dual slope analog to digital converter (ADC) is illustrated in FIG. 1. According to the circuit, the input voltage range is narrow. For example, in the case that the input transistor pair of the input operational amplifier (OPAMP) 301 is NMOS, the input range of the OPAMP is from about 1V to VDD. In the case of the mobile application product or LSI using advanced process technology, the power supply voltage VDD is usually low, ranging from 1.5V to 3V. This makes the range of input voltage narrow, causing it difficult to get enough resolution of ADC. Thus a dual slope ADC with rail to rail (VSS to VDD) input range is desired.

SUMMARY OF INVENTION

An object of the present invention is to provide rail to rail input range, a minor error and finer resolution of ADC.

Another object of the present invention is to provide a dual slope ADC with a single pin external capacitor connection.

The dual slope ADC circuit scheme of this present invention includes an input stage, an integrator stage, and a comparator stage. For the input stage, the circuit is composed of a first operational amplifier (OPAMP). The input voltage is stored in a first capacitor, which is connected in negative feedback loop fashion of the first OPAMP, and this voltage is then applied between the output terminal and the negative input of the first OPAMP. The first OPAMP keeps the voltage of the positive input to be the same as the negative input of which. The current flowing through a first resistor is linearly proportional to the input voltage, where the first resistor couples the output of the first OPAMP and a second OPAMP, which is part of the integrator. The second OPAMP and a second capacitor work as an integrator to charge the current from the resistor, where the second capacitor is connected in negative feedback loop fashion of the second OPAMP. The comparator stage, comprising a third OPAMP, checks the voltage across the second capacitor. A third capacitor coupling to the negative input terminal of the second OPAMP compensates the offset voltages of the first OPAMP. On the other hand, a plurality of switches are controlled to make the necessary connections for the different operation phases, including offset cancellation phase, integration phase, discharge phase, and charge reset phase. The phases are described as follows.

The offset cancellation phase of the rail to rail dual slope ADC of this present invention is described herein. At a stable state, the voltage across the first resistor becomes zero, the voltage across the third capacitor is equal to the offset voltage of the first OPAMP, the negative input of the second OPAMP is determined by an analog ground voltage (AGND) and the offset voltage of the second OPAMP, and the positive input of the third OPAMP is determined by the output voltage and the offset voltage of the third OPAMP.

The integration phase of the rail to rail dual slope ADC of this present invention is described herein. The voltage across the first resistor is the input voltage VIN. The current through the first resistor charges the second capacitor and the output voltage of the second OPAMP decrease constantly if VIN is positive.

The discharge phase of the rail to rail dual slope ADC of this present invention is described herein. The voltage across the first resistor is the input voltage Vref, which is a predetermined constant voltage. The current through the first resistor discharges the second capacitor and the output voltage of the second OPAMP increase constantly if Vref is minus. The output voltage of the third OPAMP changes from low to high, when the output voltage of the second OPAMP across the initial voltage, which is determined after the offset cancellation phase. This change of the output voltage of the third OPAMP indicates the completion of the discharge phase.

The charge reset phase of the rail to rail dual slope ADC of this present invention is described herein. In this phase, unnecessary residual charge in the second capacitor is discharged to the initial voltage,which is determined after the offset cancellation phase. The difference from the offset cancellation phase is that the charge reset phase can discharge the unnecessary charge in the second capacitor more quickly than the offset cancellation phase. Although the charge reset phase has the similar function as the offset cancellation phase, the offset cancellation is still necessary to refresh the voltage across the third capacitor.

Accordingly, the present invention has wider input voltage range than the conventional scheme, since the input voltage range of the present invention is rail to rail (from VSS to VDD) whereas that of the conventional scheme is about from 1V to VDD. For example, if VDD is 1.5V, the input voltage range of the conventional scheme is only 0.5V, while the input voltage range of the present invention is 1.5V, which consequently is able to provide finer resolution of ADC.

Moreover, since the input voltage of the first OPAMP is kept around AGND, the offset voltage of the first OPAMP is not affected by the input voltage, and a minor error and finer resolution are obtained in this present invention.

A simplified scheme of the rail to rail dual slope ADC of this present invention is described herein. In this configuration, there is no integrator OPAMP. Instead, the current flowing through the first resistor charges an external capacitor through single pin. The operation of the circuit is similar to that with integrator. The difference is that the voltage of the positive input of the first OPAMP changes according to the terminal voltage of the external capacitor in the integration phase and the discharge phase. This change of the positive input of the first OPAMP reduces the input voltage range. Since the circuit is configured with single pin capacitor connection, this circuit is exemplary useful for applications that do not require high resolution but require-temptemp small pin count and simple circuit. Notice that this circuit is applied to a VCO as an example.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 2:
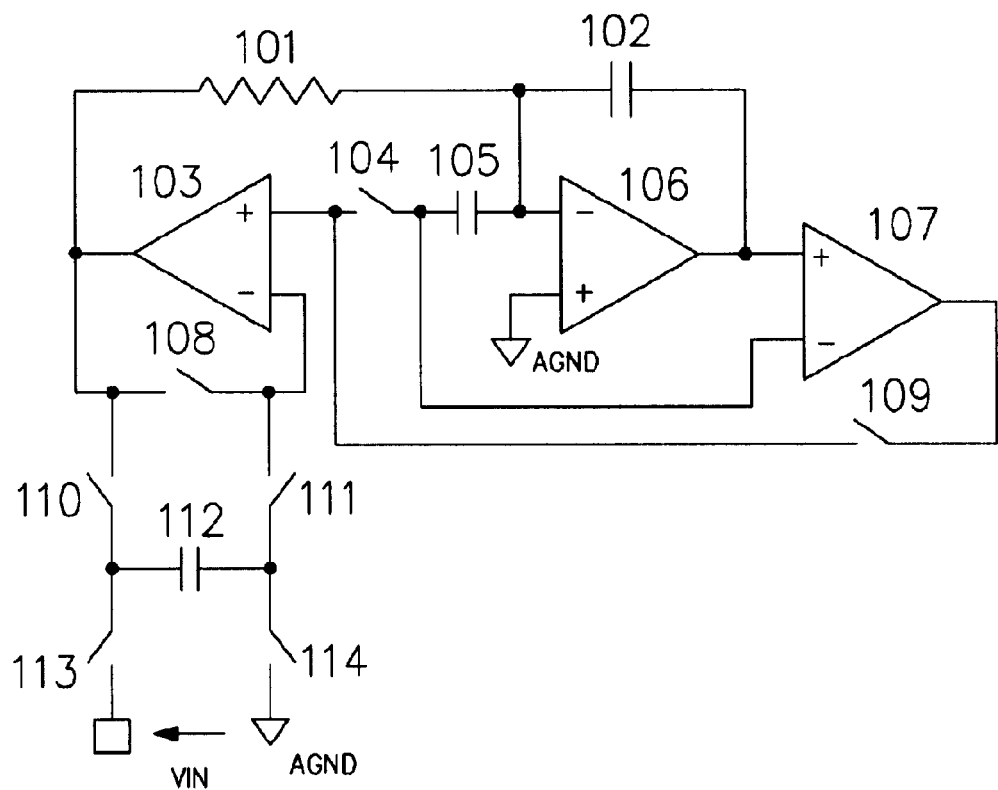
FIG. 2 is a circuit diagram illustrating a dual slope ADC according to the first preferred embodiment of the present invention.

Referring to FIG. 2, it is a circuit diagram illustrating a preferred embodiment of this present invention. The input voltage VIN is stored in the capacitor 112, and this voltage is then applied between the output terminal and the negative input of the operational amplifier (OPAMP) 103. The OPAMP 103 keeps the voltage of the positive input to be the same as the negative input of OPAMP 103. The current flowing through the resistor 101 is linearly proportional to the input voltage. The OPAMP 106 and the capacitor 102 work as an integrator to charge the current from the resistor. The OPAMP 107 checks the voltage across the capacitor 102. The capacitor 105 compensates the offset voltages of the OPAMP 103. Switches 104, 108, 109, 110, 111, 113, and 114 are controlled to make the necessary connections for the different operation phases, including offset cancellation phase, integration phase, discharge phase, and charge reset phase. The circuits illustrating each the foregoing phases are shown in FIGS. 3, 4, 5, and 6 respectively.

Figure 3:
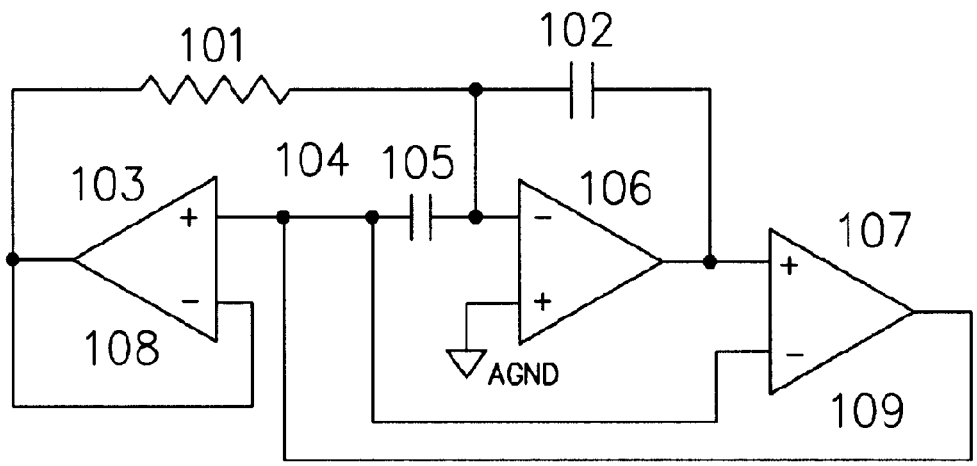
FIG. 3 is a circuit diagram illustrating a dual slope ADC according to the first preferred embodiment of the present invention during offset cancellation phase.

Referring to FIG. 3, the offset cancellation phase of the preferred embodiment is shown therein. At a stable state, the voltage across the resistor becomes zero, the voltage across the capacitor 105 is equal to the offset voltage of the OPAMP 103, the negative input of the OPAMP 106 is determined by AGND and the offset of OPAMP 106, and the positive input of the OPAMP 107 is determined by the output voltage and the offset of the OPAMP 107.

Figure 4:
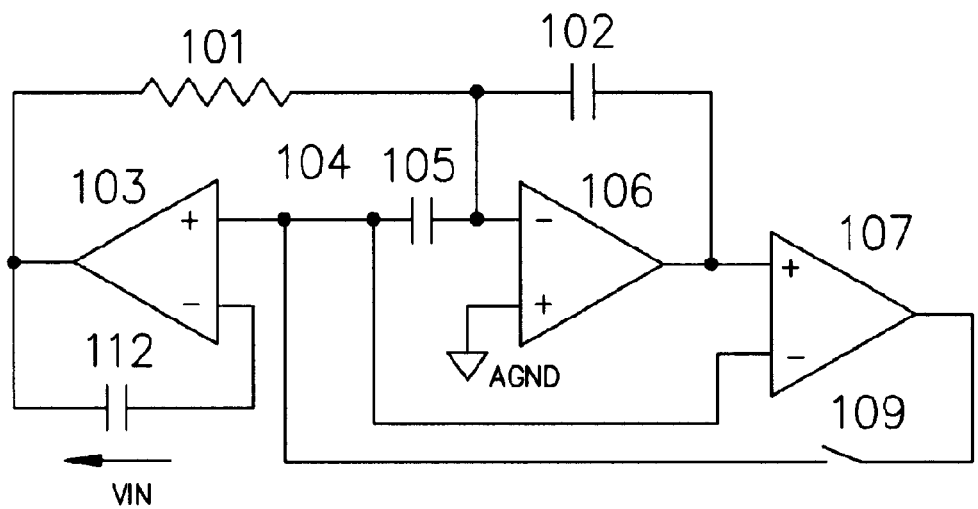
FIG. 4 is a circuit diagram illustrating a dual slope ADC according to the first preferred embodiment of the present invention during integration phase.

Referring to FIG. 4, the integration phase of the preferred embodiment is shown therein. The voltage across the resistor 101 is the input voltage VIN. The current through the resistor 101 charges the capacitor 102 and the output voltage of the OPAMP 106 decrease constantly if VIN is positive.

Figure 5:
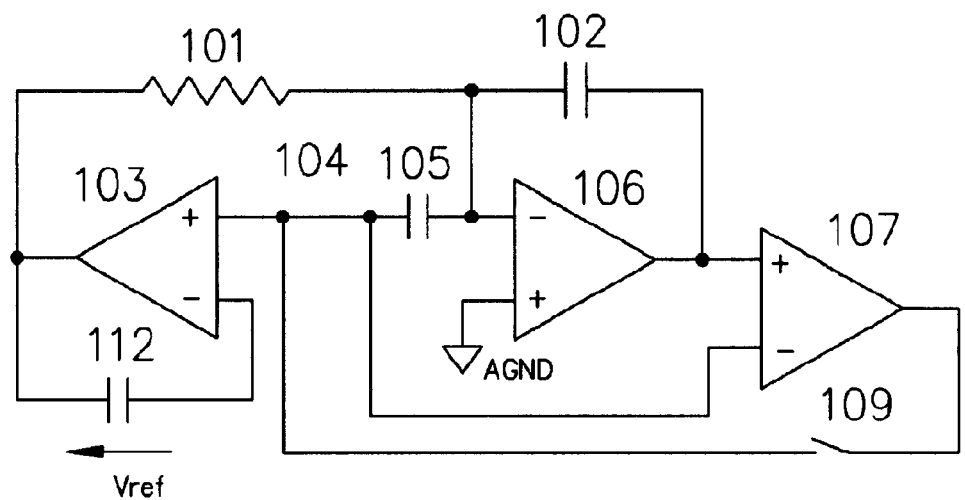
FIG. 5 is a circuit diagram illustrating a dual slope ADC according to the first preferred embodiment of the present invention during discharge phase.

Referring to FIG. 5, the discharge phase of the preferred embodiment is shown therein. The voltage across the capacitor 112 is the input voltage Vref, which is a predetermined constant voltage. The current through the resistor 101 discharges the capacitor 102, and the output voltage of the OPAMP 106 increase constantly if Vref is negative. The output voltage of the comparator 107 changes from low to high, when the output voltage of the OPAMP 106 across the initial voltage, which is determined after the offset cancellation phase. This change of the output voltage of the comparator 107 indicates the completion of the discharge phase.

Figure 6:
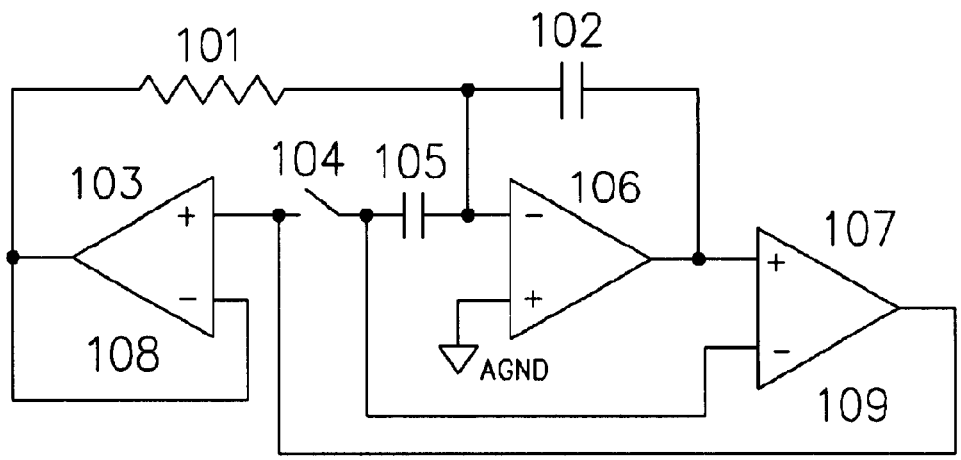
FIG. 6 is a circuit diagram illustrating a dual slope ADC according to the first preferred embodiment of the present invention during charge reset phase.

Referring to FIG. 6, the charge reset phase of the preferred embodiment is shown therein. In this phase, unnecessary residual charge in the capacitor 102 is discharged to the initial voltage, which is determined after the offset cancellation phase. The difference from the offset cancellation phase is that the charge reset phase can discharge the unnecessary charge of the capacitor 102 more quickly than the offset cancellation phase. Although the charge reset phase has the similar function as the offset cancellation phase, the offset cancellation is still necessary to refresh the voltage across the capacitor 105.

Accordingly, the present invention has wider input voltage range than the conventional scheme, since the input voltage range of the present invention is rail to rail (from VSS to VDD), whereas that of the conventional scheme is about from 1V to VDD. For example, if VDD is 1.5V, the input voltage range of the conventional scheme is only 0.5V, while the input voltage range of the present invention is 1.5V, which consequently is able to provide finer resolution of ADC.

Figure 1:
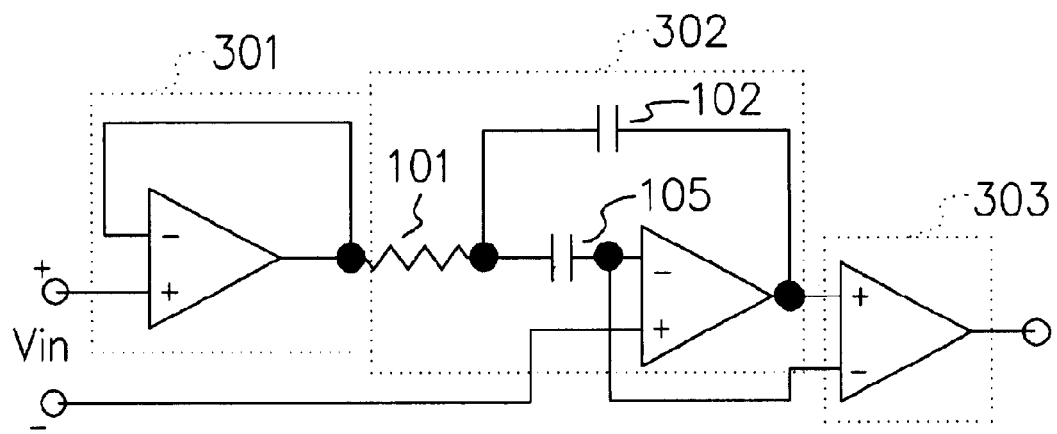
FIG.1 is circuit diagram illustrating a dual slope ADC according to a prior art.

Moreover, since the input voltage of the input OPAMP is kept around AGND, the offset of the OPAMP is not affected by the input voltage, and a minor error and finer resolution are obtained in this present invention. Whereas the scheme of the conventional circuit results in error for OPAMP 301 in FIG. 1 is a voltage follower whose offset voltage changes according to the input voltage.

Figure 7:
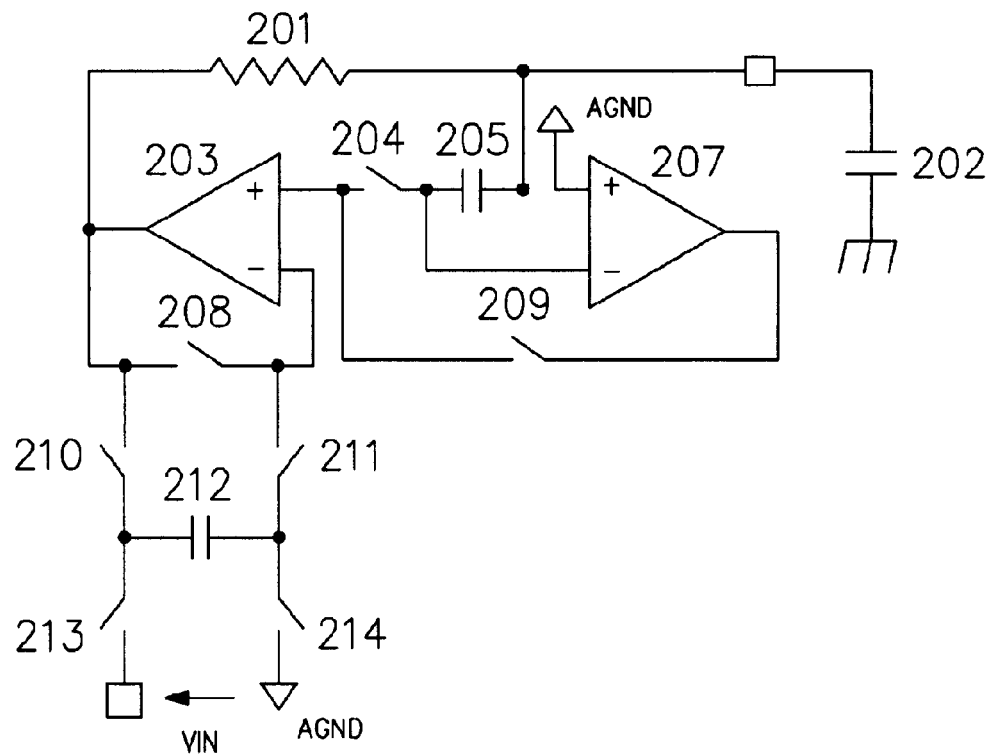
FIG. 7 is a circuit diagram illustrating a dual slope ADC according to the second preferred embodiment of the present invention.
Figure 8:
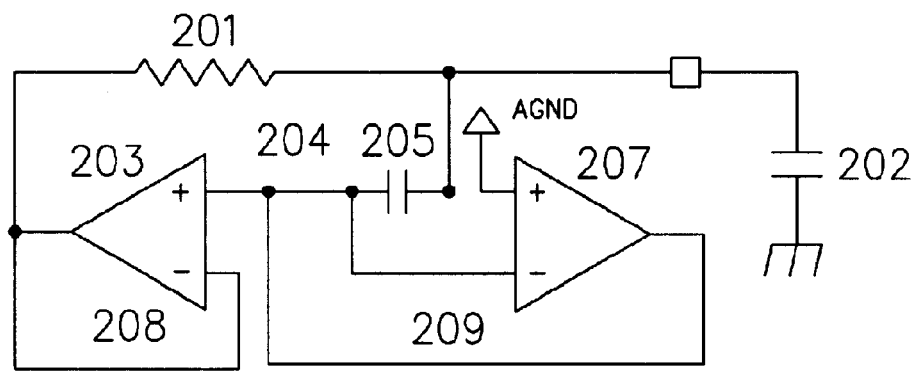
FIG. 8 is a circuit diagram illustrating a dual slope ADC according to the second preferred embodiment of the present invention during offset cancellation phase.
Figure 9:
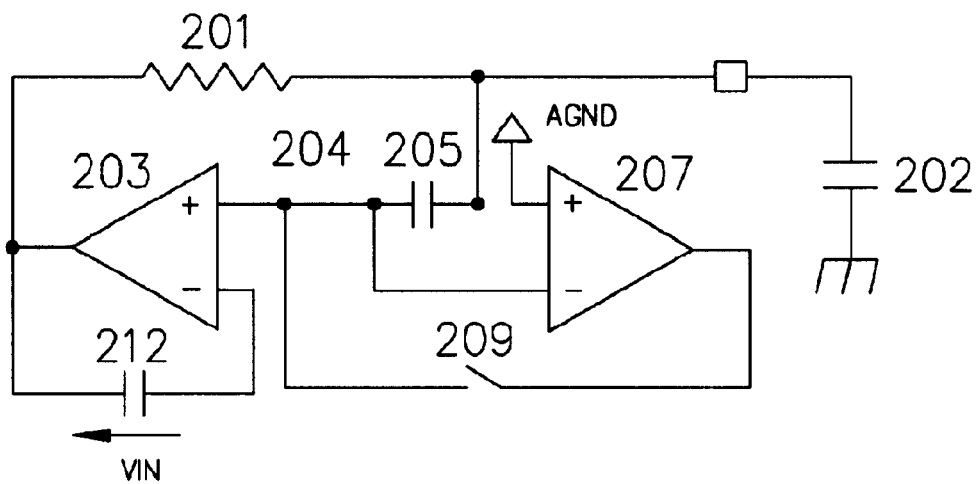
FIG. 9 is a circuit diagram illustrating a dual slope ADC according to the second preferred embodiment of the present invention during integration phase.
Figure 10:
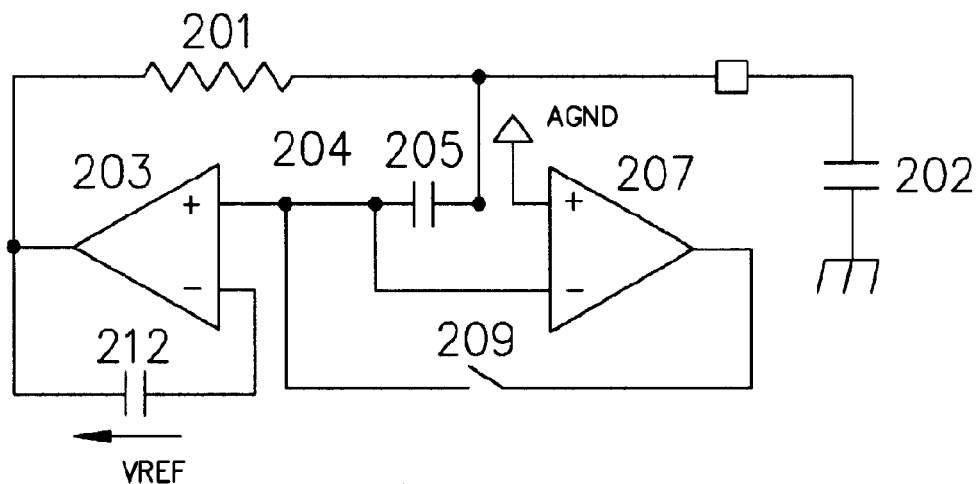
FIG. 10 is a circuit diagram illustrating a dual slope ADC according to the second preferred embodiment of the present invention during discharge phase.
Figure 11:
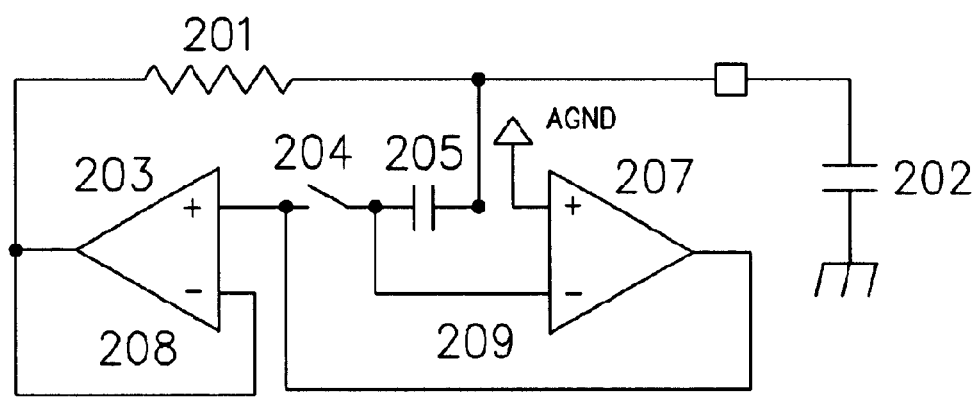
FIG. 11 is a circuit diagram illustrating a dual slope ADC according to the second preferred embodiment of the present invention during charge reset phase.

Referring to FIG. 7, it is a circuit diagram illustrating another preferred embodiment of the present invention. In this configuration, there is no integrator OPAMP. Instead, the current flowing through the resistor 201 charges the external capacitor 202 through single pin. The operation of the circuit of FIG. 7 is similar to that of FIG. 2. The difference is that the voltage of the positive input of the OPAMP 203 changes according to the change of the terminal voltage of the external capacitor 202 in the integration phase and the discharge phase. This change of the positive input of the OPAMP 203 reduces the input voltage range. Since the circuit is configured with single pin capacitor connection, this circuit is exemplary useful for such applications that do not require high resolution but require small pin count and simple circuit. Notice that this circuit is applied to a VCO as an example. Also notice that the offset cancellation phase, integration phase, discharge phase, and charge reset phase are illustrated in FIGS. 8–11 similarly to FIGS. 3–6.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A dual slope analog to digital converter, comprising:
   a first operational amplifier;
   an integrator;
   a comparator, whose positive input is coupled to the output of the integrator;

a resistor coupling the output of the first operational amplifier and the first input of the integrator; and a first capacitor coupling the first input of the integrator and the negative input of the comparator, wherein a plurality of couplings are controlled by a plurality of switches, comprising:

a first coupling, controlled by a first set of switches, for optionally forming a negative feedback loop for the first operational amplifier;

a second coupling, controlled by a second switch, for optionally forming connection between the negative input of the comparator and the positive terminal of the first operational amplifier, and a third coupling, controlled by a third switch, optionally forming connection of feedback loop from the output of the comparator to the positive terminal of the first operational amplifier.

2. The dual slope analog to digital converter as recited in claim 1, wherein the integrator at least comprises:

a second operational amplifier, having a positive input terminal that is coupled to an analog ground voltage;

a second capacitor, being negatively feedback looped of the second operational amplifier.

3. The dual slope analog to digital converter as recited in claim 1, wherein the couplings are controlled for a plurality of phases, comprising:

an offset cancellation phase, wherein the first coupling is on, the second coupling is on, and the third coupling is on;

an integration phase, wherein the first coupling is on via a first capacitor supplying a first voltage across which, the second coupling is on, and the third coupling is off;

a discharge phase, wherein the first coupling is on via the first capacitor supplying a second voltage across which, the second coupling is on, and the third coupling is off; and a charge reset phase, wherein the first coupling is on, the second coupling is off, and the third coupling is on.

4. The dual slope analog to digital converter as recited in claim 1, wherein the comparator comprises a third operational amplifier.

5. A dual slope analog to digital converter, comprising:

a first operational amplifier;

a comparator, whose positive input is coupled to an analog ground;

a first resistor, coupling a first pin an output of the first operational amplifier;

a first capacitor, coupling negative input of the comparator and the first pin and a second capacitor, coupling the first pin and a ground, wherein a plurality of couplings are controlled by a plurality of switches, comprising:

a first coupling, controlled by a first set of switches, for optionally forming a negative feedback loop of the first operational amplifier, a second coupling, controlled by a second switch, for optionally forming connection between positive input terminal of the first operational amplifier and negative input terminal of the comparator, and a third coupling, controlled by a third switch, for optionally forming a negative feedback loop from the output of the comparator to the positive terminal of the first operational amplifier.

6. The dual slope analog to digital converter as recited in claim 5, wherein the comparator comprises a second operational amplifier.

7. The dual slope analog to digital converter as recited in claim 5, wherein the couplings are controlled for a plurality of phases, comprising:

an offset cancellation phase, wherein the first coupling is on, the second coupling is on, and the third coupling is on;

an integration phase, wherein the first coupling is on via a third capacitor supplying a first voltage across which, the second coupling is on, and the third coupling is off;

a discharge phase, wherein the first coupling is on via the third capacitor supplying a second voltage across which, the second coupling is on, and the third coupling is off; and a charge reset phase, wherein the first coupling is on, the second coupling is off, and the third coupling is on.

* * * * *